US007982495B2

(12) United States Patent
Danilin et al.

(10) Patent No.: US 7,982,495 B2
(45) Date of Patent: Jul. 19, 2011

(54) CONFIGURABLE LOGIC DEVICE

(75) Inventors: Alexander A. Danilin, Eindhoven (NL); Martinus T. Bennebroek, Den Bosch (NL); Sergei V. Sawitzki, Veldhoven (NL)

(73) Assignee: ST-Ericsson SA, Geneva (CH)

( * ) Notice: Subject to any disclaimer, the term of this patent is extended or adjusted under 35 U.S.C. 154(b) by 0 days.

(21) Appl. No.: 12/310,465

(22) PCT Filed: Aug. 22, 2007

(86) PCT No.: PCT/IB2007/053359

§ 371 (c)(1),
(2), (4) Date: Nov. 16, 2009

(87) PCT Pub. No.: WO2008/023342

PCT Pub. Date: Feb. 28, 2008

(65) Prior Publication Data

US 2010/0097098 A1    Apr. 22, 2010

(30) Foreign Application Priority Data

Aug. 25, 2006 (EP) ..................................... 06119507

(51) Int. Cl.
*H03K 19/173* (2006.01)
*G06F 17/50* (2006.01)
(52) U.S. Cl. .......................................... 326/38; 716/117
(58) Field of Classification Search .................. 712/32, 712/218; 326/37–41, 47
See application file for complete search history.

(56) References Cited

U.S. PATENT DOCUMENTS

| 5,914,892 | A  | * | 6/1999  | Wang et al. ................... 708/626 |
| 6,069,487 | A  | * | 5/2000  | Lane et al. ........................ 326/37 |
| 6,140,839 | A  | * | 10/2000 | Kaviani et al. .................. 326/39 |
| 6,369,610 | B1 | * | 4/2002  | Cheung et al. ................... 326/41 |
| 7,237,087 | B2 | * | 6/2007  | Vorbach et al. ................. 712/15 |
| 7,822,799 | B1 | * | 10/2010 | Langhammer et al. ........ 708/551 |
| 2003/0056085 | A1 |   | 3/2003  | Vorbach et al. |
| 2005/0231235 | A1 |   | 10/2005 | Crotty et al. |

OTHER PUBLICATIONS

International Search Report dated Jan. 11, 2008 in connection with PCT Patent Application No. PCT/2007/053359.
Mitchell J. Myjak, et al., "A Bit-Serial Cell for Reconfigurable DSP Hardware", 2005 IEEE, p. 960-963.
Katarzyna Leijten-Nowak, et al., "An FPGA Architecture with Enhanced Datapath Functionality", Feb. 23-25, 2003, p. 195-204.

* cited by examiner

*Primary Examiner* — Vibol Tan
*Assistant Examiner* — Dylan White

(57) ABSTRACT

The configurable logic device comprises a plurality of configurable logic cells (2). A configurable logic cell comprises a plurality of multi-bit registers (20a, 20b, 20c, 20d). At least one is accessible both in a parallel and in a serial fashion. A functional unit (30) therein is coupled to two or more of the registers and comprises a chain of functional unit segments (31, 31') that each comprise an AND gate (33) and a 1-bit full adder (32) receiving an output of the AND-gate. An output selection facility (50) provides an output signal of the configurable logic cell selected from two or more input signals. At least one of the input signals is provided by one of the multi-bit registers, and another by the functional unit.

9 Claims, 16 Drawing Sheets

CONFIGURABLE LOGIC DEVICE

CROSS-REFERENCE TO RELATED APPLICATION(S)

The present application claims priority under 35 U.S.C. §365 to International Patent Application No. PCT/IB2007/053359 filed Aug. 22, 2007, entitled "CONFIGURABLE LOGIC DEVICE". International Patent Application No. PCT/IB2007/053359 claims priority under 35 U.S.C. §365 and/or 35 U.S.C. §119(a) to European Patent Application No. 06119507.9 filed Aug. 25, 2006 and which are incorporated herein by reference into the present disclosure as if fully set forth herein.

BACKGROUND OF THE INVENTION

The present invention relates to a configurable logic device.

Reconfigurable systems, like Field-Programmable Gate Arrays (FPGAs), are capable of combining the flexibility of software with the performance of hardware. Modern FPGAs provide several thousands of logic cells that allow mapping of complex algorithms directly to hardware. If maximum hardware performance is not demanded within a given application, its execution can be split-up in time such that partitions (constituting the entire application) are subsequently executed on a reduced number of logic cells. This well-known space-time computing approach is widely used in general-purpose reconfigurable computing at algorithmic level. The hierarchical architecture of some FPGA families, where logic blocks are grouped into clusters that can implement small to mid-range logic functions spatially, facilitates such space-time algorithmic approaches. Such an architecture is described for example by Mirksy, E. A. et. all. in "MATRIX: A Reconfigurable Computing Architecture with Configurable Instruction Distribution and Deployable Resources." In J. M. Arnold, K. L. Pocek (eds.) "Proceedings of the IEEE Workshop on FPGA for Custom Computing Machines", IEEE 1996, pp. 157-166. In this article they describe how a convolution task is implemented by various algorithms including a systolic implementation, a micro coded implementation, a custom VLIW (horizontal micro code) implementation and a VLIW/MSIMD implementation.

SUMMARY OF THE INVENTIONS

It is a purpose of the present invention to provide a configurable logic device that allows for a different way of exchanging space for time mapping. It is recognized by the inventors that it is desirable to have a configurable logic device in which the space-time exchange can be made at a logic cell level rather than at an algorithmic level. In this way a particular application can be more simply transported from a more space oriented to a more time oriented environment and the other way round.

This purpose is achieved by the combined subject-matter of claim 1.

The architecture in claim 1 allows a multiplication operation to be performed in a temporal or spatial manner. For example, an 8-bit multiplier can be mapped on a single cell requiring 9 computational cycles or, alternatively, on 8 cells in a transparent manner (i.e. no cycles required). As most algorithms use multiplications, this makes it possible in most cases to map the same algorithm in a more time oriented or more space oriented way. The multi-bit registers that are accessible in a parallel and serial way and the output selection facility allow the functional unit to be used in a temporal way so that a final result can be obtained in a plurality of cycles with a modest number (e.g. 1) of logic cells or in the spatial way. In that case a plurality of functional units is switched in parallel and the final result is obtained in a small number of clock cycles (e.g. 1) more with no clock cycles with all, only requiring a combinatorial delay.

A selection facility can be implemented for example by a multiplexer. Where the use of multiplexers has been described it should be understood that these multiplexers could be implemented with any circuit that has a multiplex function. This includes a logic circuit with an input output relation that copies data from one data input or another dependent on the value of a control signal on a control data input, a circuit with control signal controlled switches between the output and respective inputs, or tri-state drivers with outputs coupled to a multiplexer output and inputs coupled to the respective inputs, the control signal determining which of the drivers will not be in a high impedance output state.

In each case, the multiplexer function may be integrated with the combinatorial logic circuits that precede the multiplexer, e.g. by using tri-state stages in the final stage of the preceding combinatorial logic circuit, or by integrating the input output relation of the combinatorial logic circuit with the input output relation that corresponds to multiplexing.

The architecture according to the invention can be implemented with a lower or a higher number of registers. A relatively low number of registers has the advantage that the cell area is relatively small. Claim 2 specifies an embodiment wherein the logic cell has two registers.

In some cases however more logic cells may be necessary to implement the function than in the case of an architecture where the logic cell has a relatively high number of registers. This is particularly so for temporal mappings. Then an architecture with a higher number of registers per logic cell is desirable. Such an embodiment is described in claim 3. This embodiment, using 4 registers, makes it possible to map a temporal multiplication on a single logic cell.

It was found favorable to use separate routing structures for routing data and control signals between the logic cells. On the one hand the number of data signals provided and received by a logic cell is significantly higher than the number of control signals. For example a logic cell may exchange in the order of 10 to 20 control signals, while it may exchange some hundreds of data signals. Furthermore control signals generally require a more global distribution than data signals. In an embodiment the routing structure for data signals selectively couples a register cell to any register of any of its 4 direct neighbors. In an embodiment the routing structure for control signals provides for a global routing through the configurable logic device. It is noted however, that using separate control and data paths is not essential for the present invention. Alternatively data and control signals may be transferred via a common routing circuit.

In order to allow also a more global routing for data signals, claim 7 describes an architecture, wherein the output selection facility receives an input signal from the input selection facility. In this way data can be routed via intermediate logic cells to a destination logic cell without significant delay.

Claim 8 describes an alternative implementation that makes it possible to use a logic cell as a clocked router element with 1 cycle delay. This further increases the routing possibilities. Preferably the intermediate selection facility described therein is implemented as described in claim 9. This intermediate selection facility can execute various functions, namely a 32:1 single-bit multiplexer, 8-bit wide 4:1 multiplexer or 5-bit look-up-table.

In the embodiment of claim 10 the value in the one of the registers can be easily compared with the value in the other registers. This is also useful when implementing a counter that has to count a predetermined range.

BRIEF DESCRIPTION OF THE DRAWINGS

These and other aspects of the invention are described in more detail with reference to the drawing. Therein.

DETAILED DESCRIPTION OF THE EMBODIMENTS

Figure 1:
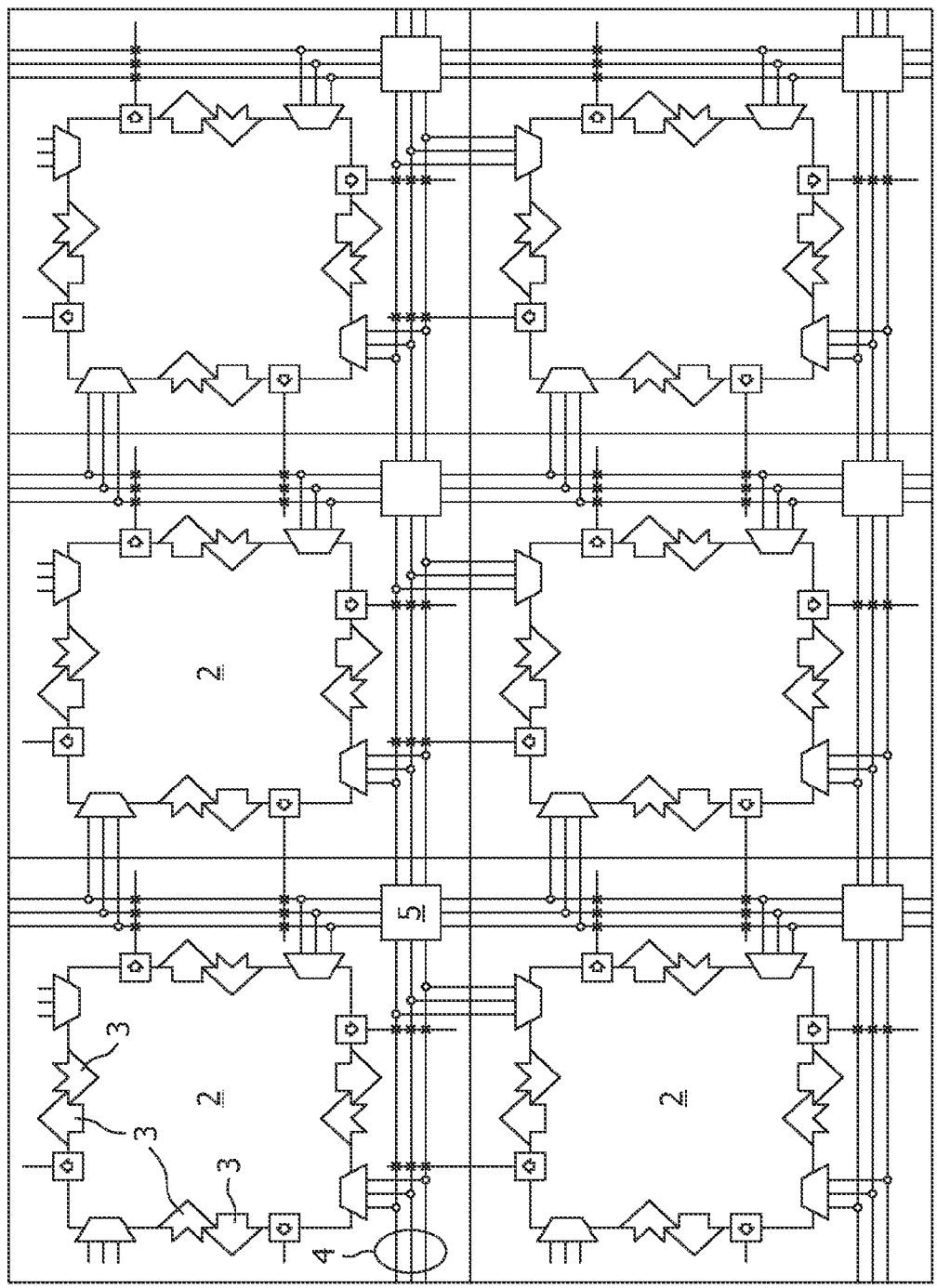
FIG. 1 shows an overview of a configurable logic device 1 according to the present invention.

FIG. 1 shows an overview of a configurable logic device 1 according to the present invention. The logic device comprises a plurality of configurable logic cells 2. In the embodiment shown the cells 2 are arranged in a 2-dimensional array. Alternatively another topology may be used, such as a linear array or a 3D array. The configurable logic device according to the invention can be implemented either as independent configurable logic device or as an embedded configurable logic within a more complex system. Preferably the logic device can configured an arbitrary number of times, i.e. is reconfigurable. Alternatively however, the configuration may be applied permanently. The configurable logic cells are coupled by routing structures, including separated data and control interconnections. The data interconnect is implemented by means of 8-bit busses 3 and connects a cell to any of its 4 direct neighbors (east, west, north or south).

The control interconnect 4 distributes bit-level signals like carry (in/out) and/or LUT outputs. Such signals are typically used to control the data flow or to locally reset specified logic cells and are distributed via a segment-based network comprising switch-boxes 5. Due to the internal structure of the CLB, it is also possible to transfer N-bit data via control routing network. However, in this case, parallel-to-serial conversion has to be applied, which means that the transfer of an N-bit value through the control network requires N clock cycles.

Figure 2:
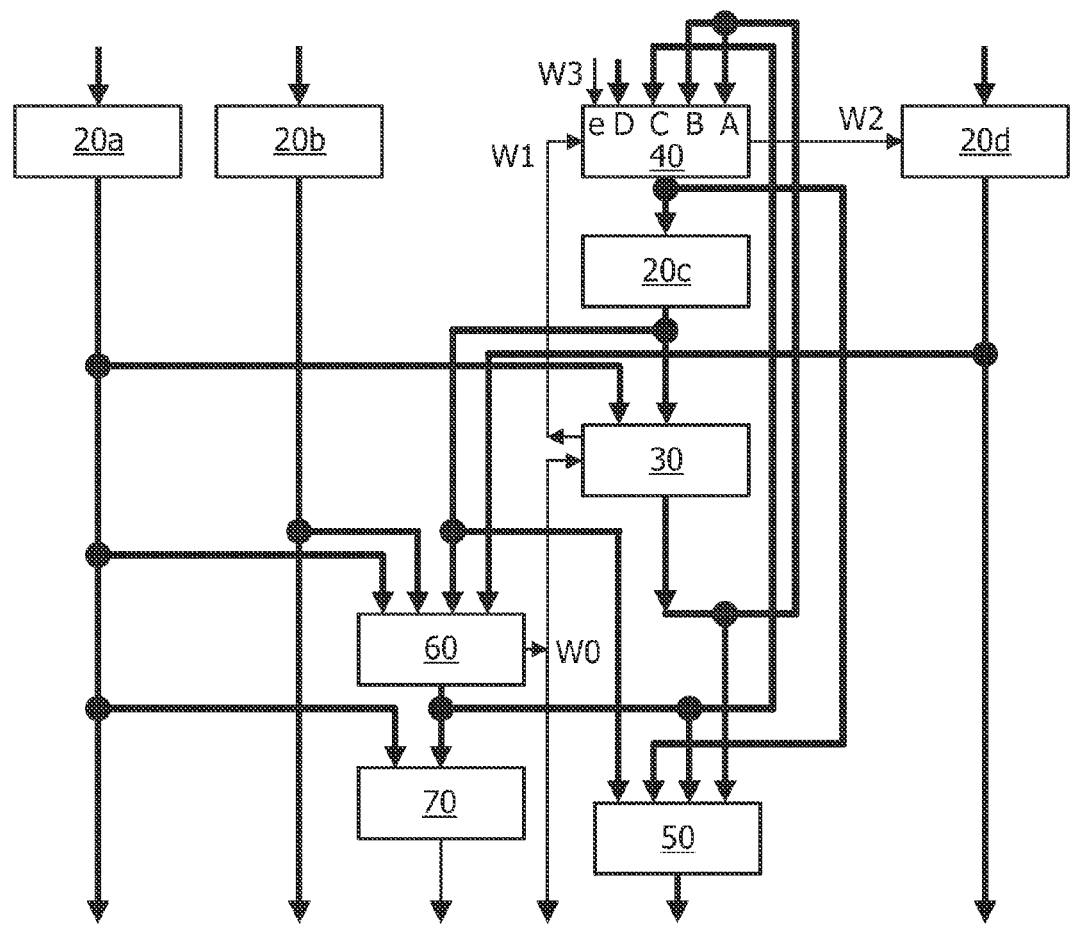
FIG. 2 shows the configurable logic cell of a first embodiment of the device shown in FIG. 1.

FIG. 2 shows in more detail a configurable logic cell 2 of the device of FIG. 1. The configurable logic cell comprises a plurality of multi-bit registers 20a, 20b, 20c, 20d.

A functional unit 30 is directly coupled to the registers 20a and 20c, and is indirectly couples to the registers 20b and 20d. At least one of the registers is accessible both in a parallel and in a serial way. As is described in more detail with reference to FIG. 4 the functional unit comprises a chain of functional unit segments that each comprise an AND gate and a 1-bit full adder receiving an output of the AND-gate.

The configurable logic cell 2 further has an output selection facility 50 for providing an output signal of the configurable logic cell selected from two or more input signals. At least one of the input signals is provided by one of the multi-bit registers, in this case 20c. Another one is provided by the functional unit 30.

The configurable logic device further has an input selection facility 40 that selectively provides one of two or more input signals to one of the multi-bit registers, here 20c. In embodiment shown the input selection facility has four parallel inputs A,B,C,D and one serial input. One of the input signals is provided by the functional unit 30 to input A. The functional units 30 also provides in input signal to input B. The input selection facility 40 causes a bit-shift-operation to a first of the input signals when selected, here the input signal received at input A and causes another one of the input signals when selected to be passed unchanged, here the input signals received at the other inputs B,C,D. The functional unit 30 also provides its output signal to an input of output selection facility 50.

The configurable logic cell has an intermediate selection facility 60 coupled to the multi-bit registers 20a, 20b, 20c, 20d. The intermediate selection facility 60, shown in more detail in FIG. 7) selectively transmits one of a set of output signals received from those registers as a further input signal for the output selection facility 50. The intermediate selection facility also provides this signal to input C of input selection facility 40. Input D of input selection facility 40 may be used to receive an external signal.

In particular the intermediate selection facility 60 comprises a first and a second selection layer 61, 62. The first selection layer 61 serves to select one of the plurality of input signals provided by the multi-bit registers 20a, 20b, 20c, 20d. The second layer 62 serves as a bit selection facility that selectively provides a bit of an output signal of one of the multi-bit registers 20a, 20b, 20c, 20d to the functional unit 30.

The configurable logic cell shown in FIG. 2 further comprises a comparator 70 for comparing an output signal of a predetermined one of the registers 20a with the output signal provided by intermediate selection facility 60.

Figure 3:
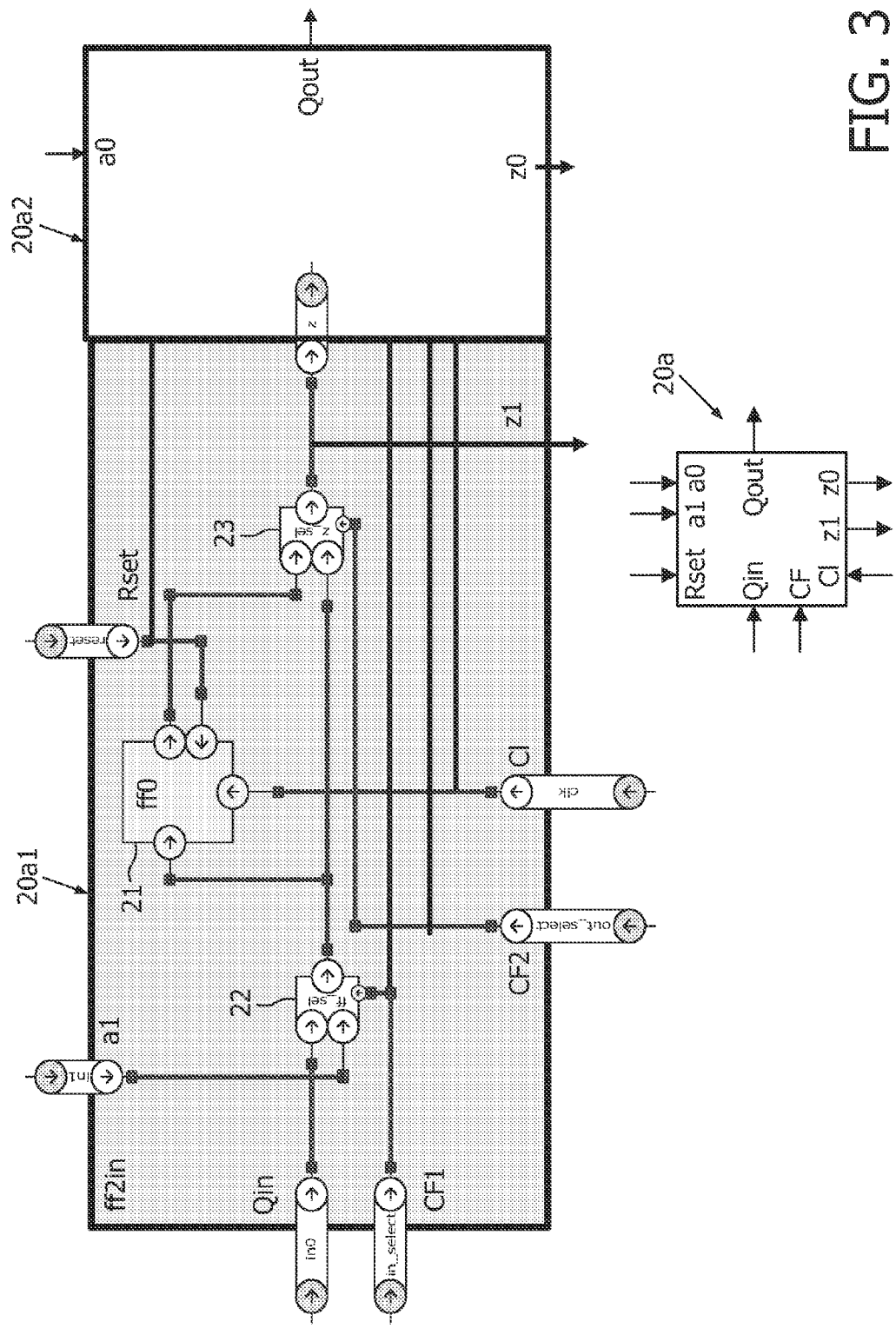
FIG. 3 shows a first part of the configurable logic cell of FIG. 2.

FIG. 3 shows in more detail one of the multi-bit registers 20a. The other registers may be identical to register 20a but may alternatively have a different construction. The register has a serial input Qin, a serial output Qout, a parallel input a0, a1, a parallel output z0, z1, configuration inputs CF1, CF2, clock input Cl and a reset input Rset. The Rset input is useful to reset the contents of the register to a predetermined value. This feature is however not strictly necessary. In the embodiment shown a transient in the clock signal causes new data to be accepted in the register 20a. As an alternative latches may be used that are transparent at a first level of a latch control signal and that hold the data at a second level of the latch control signal. As shown in more detail in the upper half of FIG. 3 the register 20a has a plurality of register segments 20a1, 20a2. For clarity reasons only two register segments are shown. However in a more practical embodiment the register will have more segments preferably a power of two, e.g. 4, 8, 16 or 32. The register segment 20a1 comprises a storage element 21. Dependent on the configuration set by configuration signal received at input CF1 an input selection element 22 coupled to the storage element 21 receives serial data at Qin or parallel data at a0, a1. Accordingly the registers are at least accessible both in a parallel and a serial fashion. In the embodiment shown the register segments also comprise a bypass element 23. Depending on a further configuration signal CF2 the bypass element 23 either selects the data selected by the input selection element or the data provided by output of the storage element as the output data z1. In the embodiment described here each of the four registers in a logic cell is fed through an 8bit-wide 16:1 multiplexer (not shown in FIG. 3) that receives data from all 16 registers located in the four neighboring cells. Indirect routing via intermediate cells is allowed to transmit data to more remote cells. Alternatively direct data connections to non-neighbor cells could be implemented.

Figure 4:
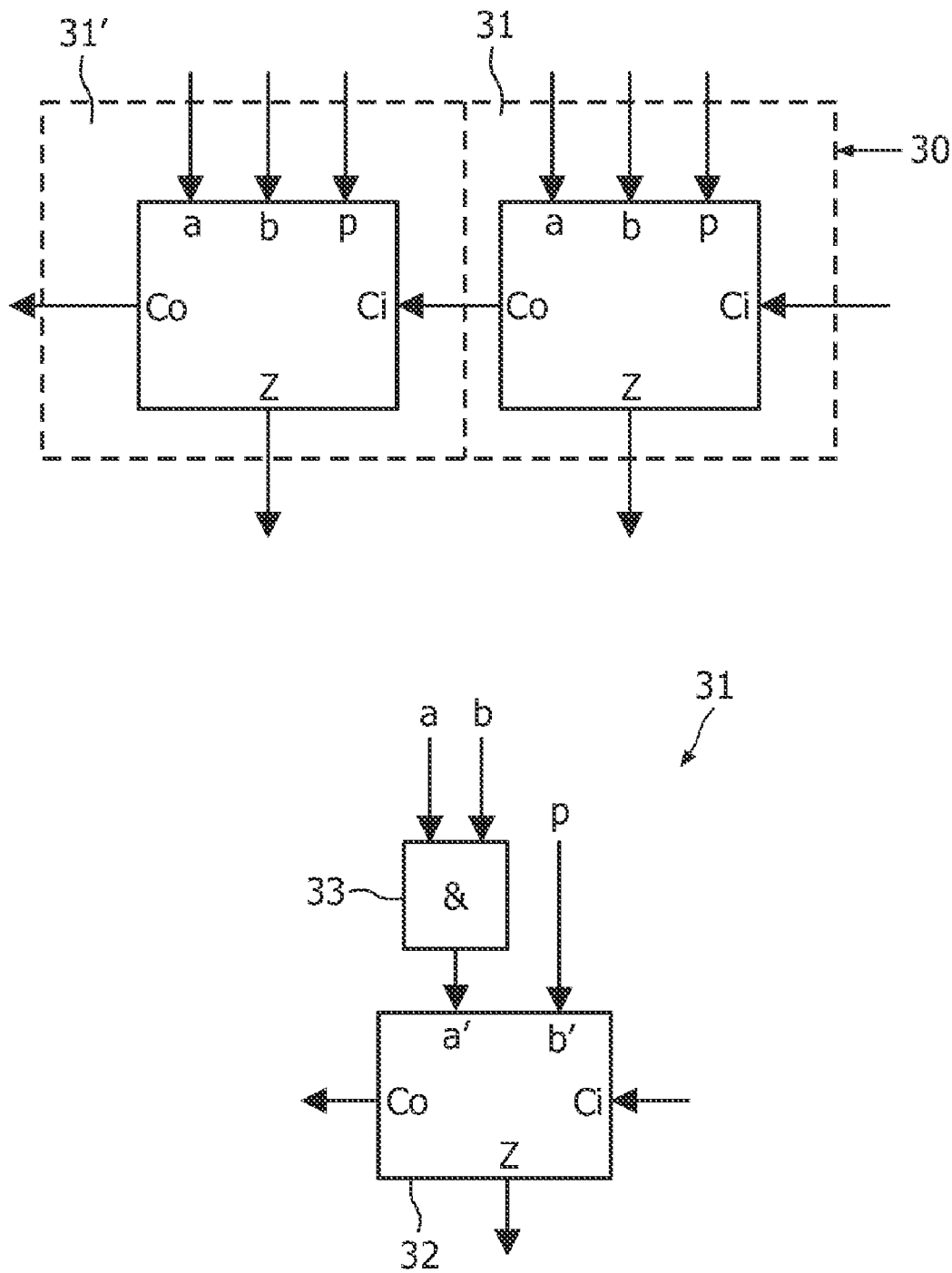
FIG. 4 shows a second part of the configurable logic cell of FIG. 2.

FIG. 4 shows a functional unit 30 in more detail. The functional unit comprises a plurality of functional units segments 31, 32. For clarity reasons only two functional unit segments are shown. However in a more practical embodiment the functional units will have more segments preferably a power of two, e.g. 4, 8, 16 or 32. The functional unit segments have inputs a, b, p and output z. The functional unit segments are arranged in a chain, having a carry output Co coupled to the carry input of the next segment 31'. An embodiment of the functional unit segment 31 is shown in more detail in the lower half of the Figure. The functional unit segment 31 shown therein comprises a full adder 32 having inputs a, b and carry input Ci, and output Z and Co. Input a' is coupled to an output of an AND element 33 with inputs a, b.

Figure 5:
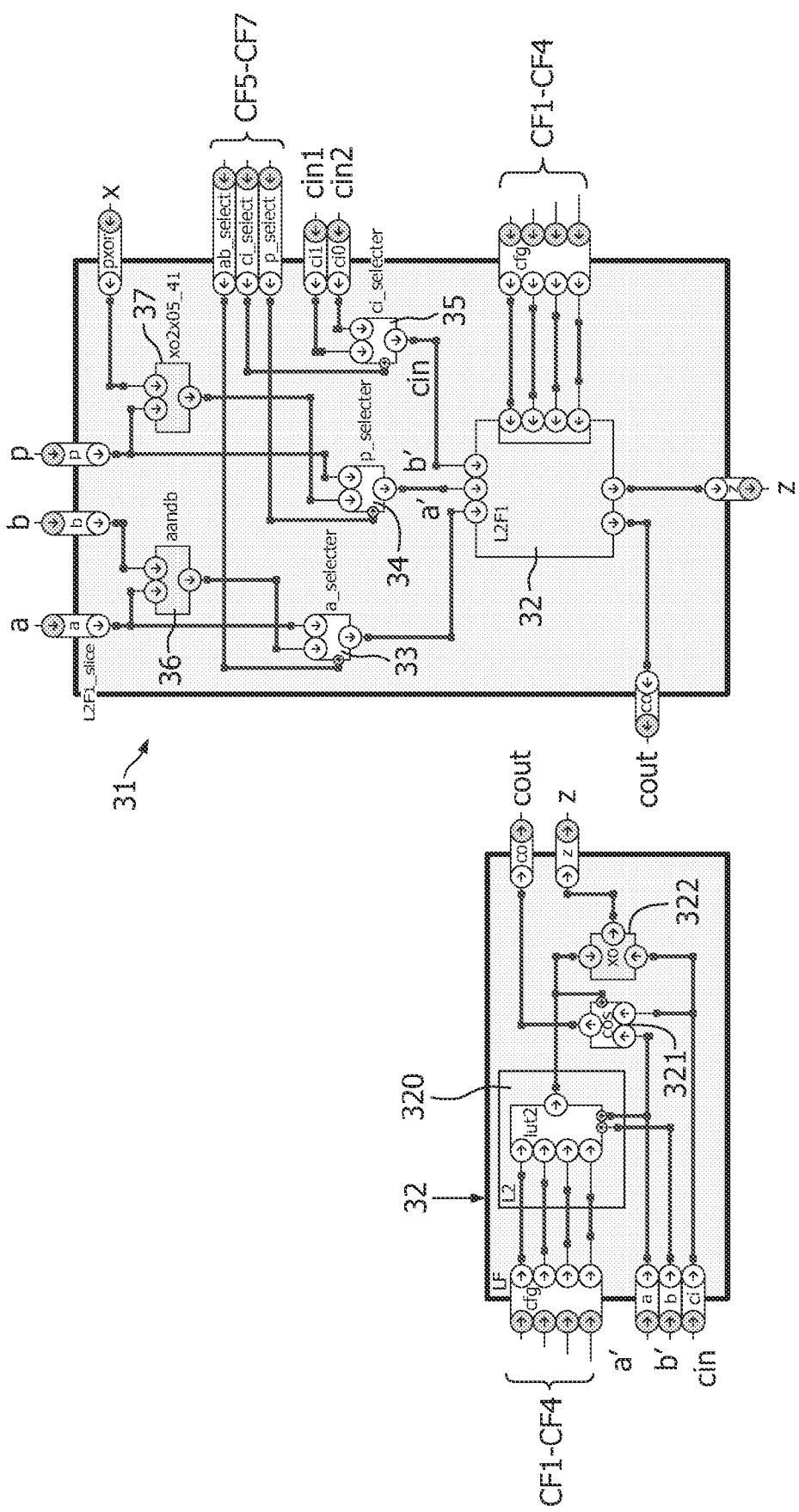
FIG. 5 shows an example of the second part in more detail.

FIG. 5 shows a more elaborate embodiment of a segment 31 of a configurable cell. The configurable cell has a processing element 32 that is configurable as a full adder. The processing element 32 is shown in more detail in a left half of the Figure. Each of the three signal inputs of the processing element a', b', cin is coupled to a 2:1 multiplexing element 33, 34, 35. A first multiplexing element 36, that is controlled by configuration signal CF5, selects either a or AND (a,b) (gate 36) as the input signal a'. A second multiplexing element 34, controlled by configuration signal CF6, selects either p or XOR (p, x) (gate 37) ST input signal b'. A third multiplexing element 35, controlled by configuration signal CF7, selects a first or a second carry input signal, cin1, cin2 as the carry input signal.

The processing element 32 shown in more detail in the left half of the Figure comprises a lookup table 320 that is configurable with signals CF1-CF4. The processing element further comprises a multiplexer element 321 for providing a carryout signal cout and an XOR gate for providing the output signal z. Processing elements 32 can be configured as a full adder. This processing element is further described in EP1397863

Figure 6:
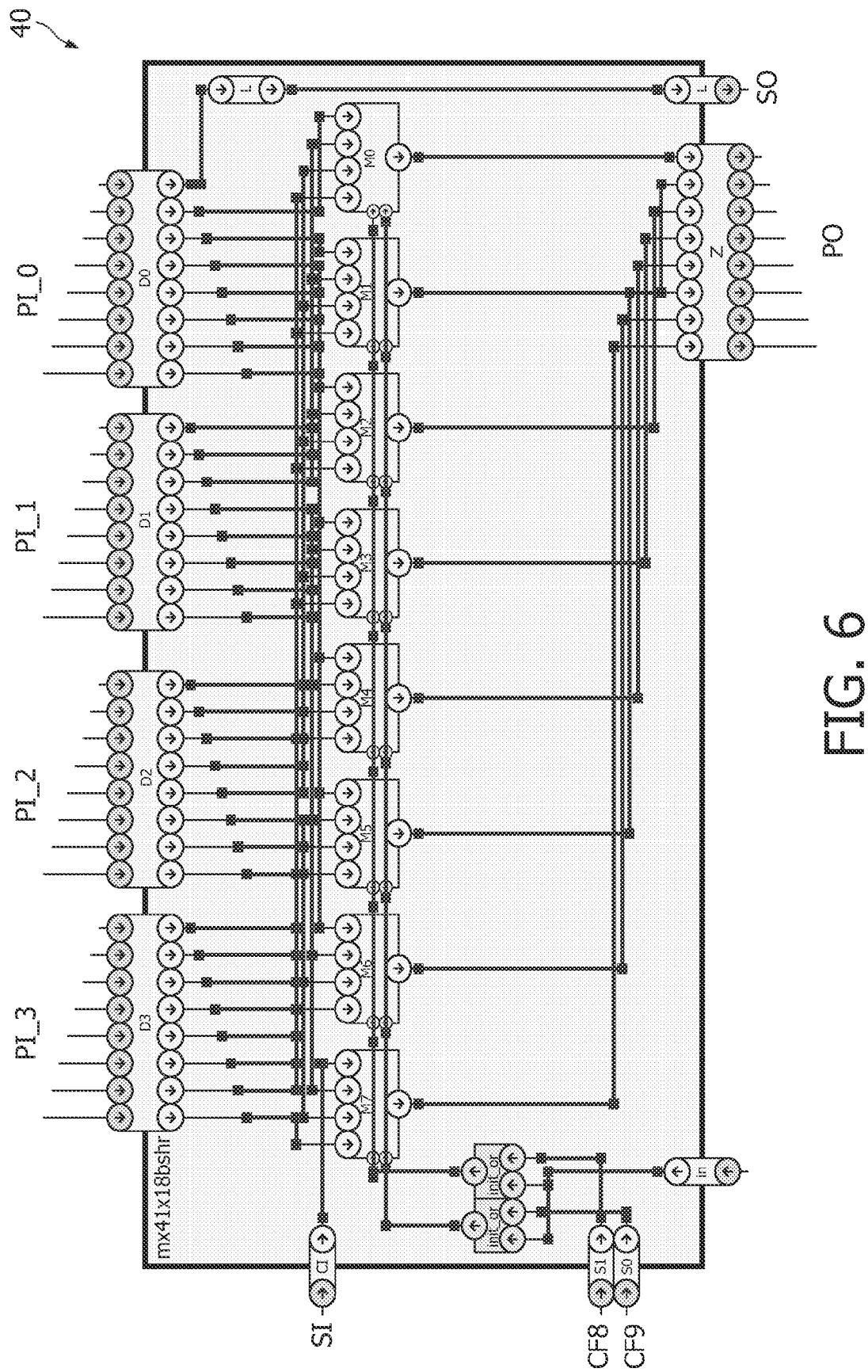
FIG. 6 shows a third part of the configurable logic cell of FIG. 2.

The input selection facility 40 of FIG. 2 is shown in more detail in FIG. 6. The input selection facility 40 has for parallel inputs PI_0, PI_1, PI_2, PI_3 and serial input SI. The input selection facility 40 further has a parallel output PO and a serial output SO. The signals at configuration input CF8,CF9 determine which of the inputs is selected. The data from the first parallel input PI_0, if selected, is shifted right. The rightmost bit of parallel input PI-0 is offered as the serial output SO. The bit received a serial input SI is offered as the leftmost bit of parallel output PO. In the embodiment of FIG. 2 the second selection facility 50 is merely a 4:1 8 bit multiplexer.

Figure 7:
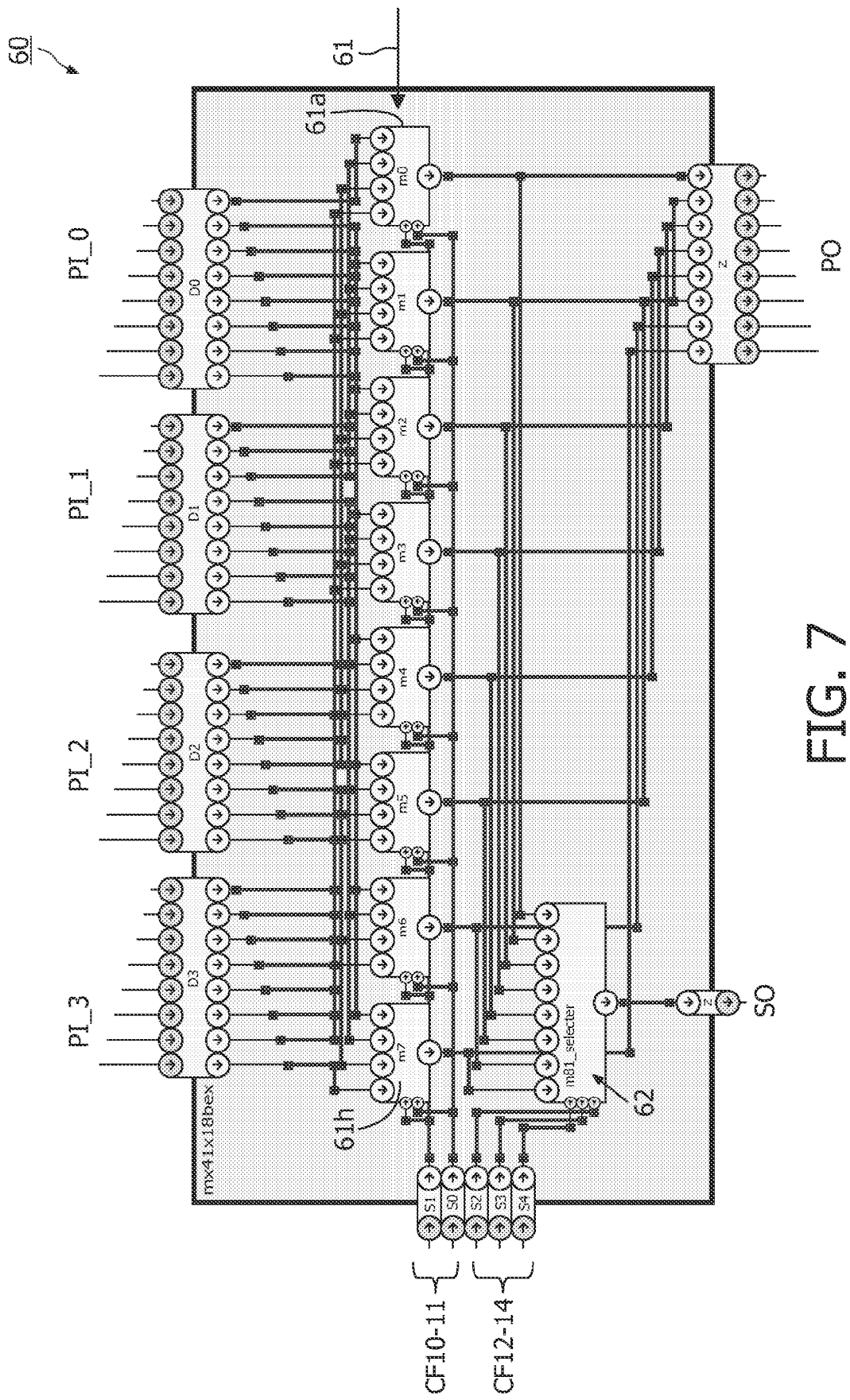
FIG. 7 shows a fourth part of the configurable logic cell of FIG. 2.

The intermediate selection facility 60 of FIG. 2 is shown in more detail in FIG. 7. This selection facility has inputs PI_0, PI_1, PI_2, PI_3 coupled to a first layer 61 of multiplexers. For clarity only multiplexers 61a and 61h are individually numbered. The multiplexers in layer 61, controlled by configuration bits CF10-CF11, each select a particular bit. For example, multiplexer 61a selects the least significant bit from the 4 least significant bits provided at the four inputs. Second layer multiplexer 62 selects one of the output bits provided by the multiplexers of the first layer 61 is the output bits to be provided at serial outputs SO. Second layer multiplexer 62 is controlled by configuration bits CF12-CF13.

Referring back to FIG. 2, it is seen that the inputs of multiplexer 60 are coupled to the registers 20a, ..., 20d. This allows the multiplexer 60 to be used as a 5:1 1bit lookup table, using all configuration bits CF10-CF14 as input, and the serial output SO. Alternatively, the multiplexer may be used as a 4:1 8-bit multiplexer using the configuration bits CF10-CF11 as inputs and the parallel output PO.

Figure 8:
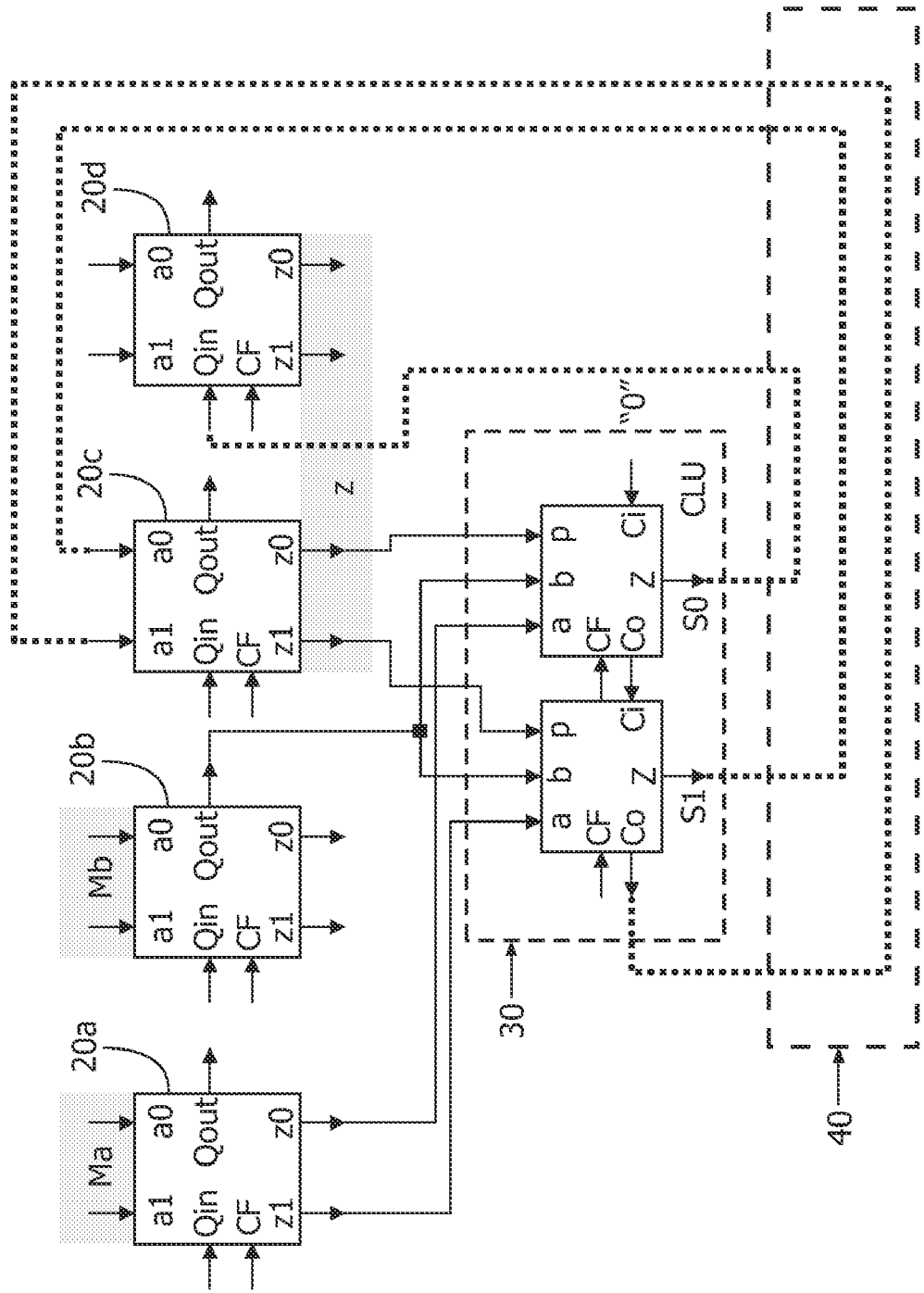
FIG. 8 shows an example of a temporal implementation of a multiplication on a configurable logic device according to the invention.

The present invention allows a reconfigurable mapping of tasks at bit-level. This makes it possible to trade space for time without making it necessary to change the algorithm. This is further explained by way of example with reference to FIGS. 8, 9 and 10. For clarity the signals Rset and Cl are not shown in the registers therein. FIG. 8 shows how a multiplication is carried out using a single logic cell configured in a temporal mode. In this mode registers 20a and 20b are used as storage elements for the multiplicands. The result of the multiplication is stored in the registers 20c and 20d. Register 20c is also used for storage of intermediary data.

Independent of whether the multiplication is carried out in spatial mode or in temporal mode the following connections can be configured statically, for example by a fixed connection. The connection may be routed via selection facility, but their setting should stay the same in the temporal mode as in the spatial mode. These connections are the connections from the parallel output of register 20a to the functional unit 30, the connection of the serial output of register 20b to the functional unit, and connections from the parallel output of register 20c to the functional units 30.

In the temporal mode a configurable connection is made from the output of the functional units 30 to the parallel input of register 20c and to the serial input of register 20d.

In the temporal mode multiplication is carried out in a plurality of cycles depending on the number of bits of the second multiplicand Mb. In this example the multiplication is carried out in 3 cycles.

In cycle 0, when registers 20a and 20b are configured in parallel mode, multiplicand "Ma" is loaded in register 20a and multiplicand "Mb" is loaded in register 20b.

In cycle 1 register 20a is reconfigured to a hold mode so that multiplicand Ma stays available at the output of register 20a. Alternatively however register 20a could be maintained in parallel mode, provided that multiplicand Ma stays available at the input of register 20a. Register 20b is a reconfigured to serial mode, so that the content of this register is shifted right 1 bit. Registers 20c and 20d are configured in parallel mode and serial mode respectively. During cycle 1 the intermediate results calculated by the functional unit 30 are stored in the registers 20c and 20d via the selection facility.

In cycle 2 the final result Z is calculated using the input data available in registers 20a and 20b and the intermediary data stored in register 20c. The final result is now available in registers 20c, 20d.

Figure 9A:
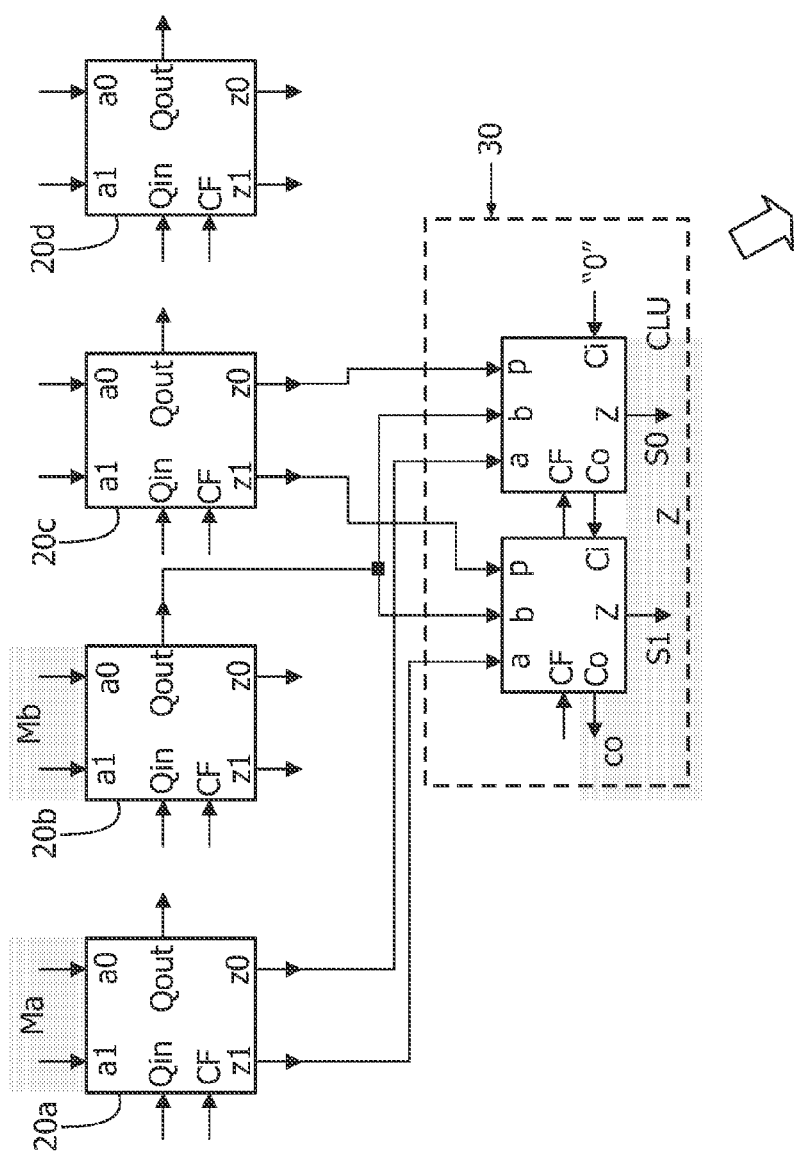
FIGS. 9A, 9B and 10 show an example of a spatial implementation of a multiplication on the configurable logic device according to the invention.
Figure 9B:
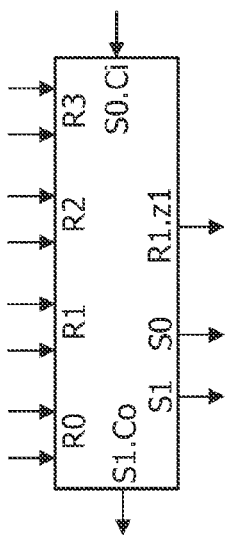
Figure 10:
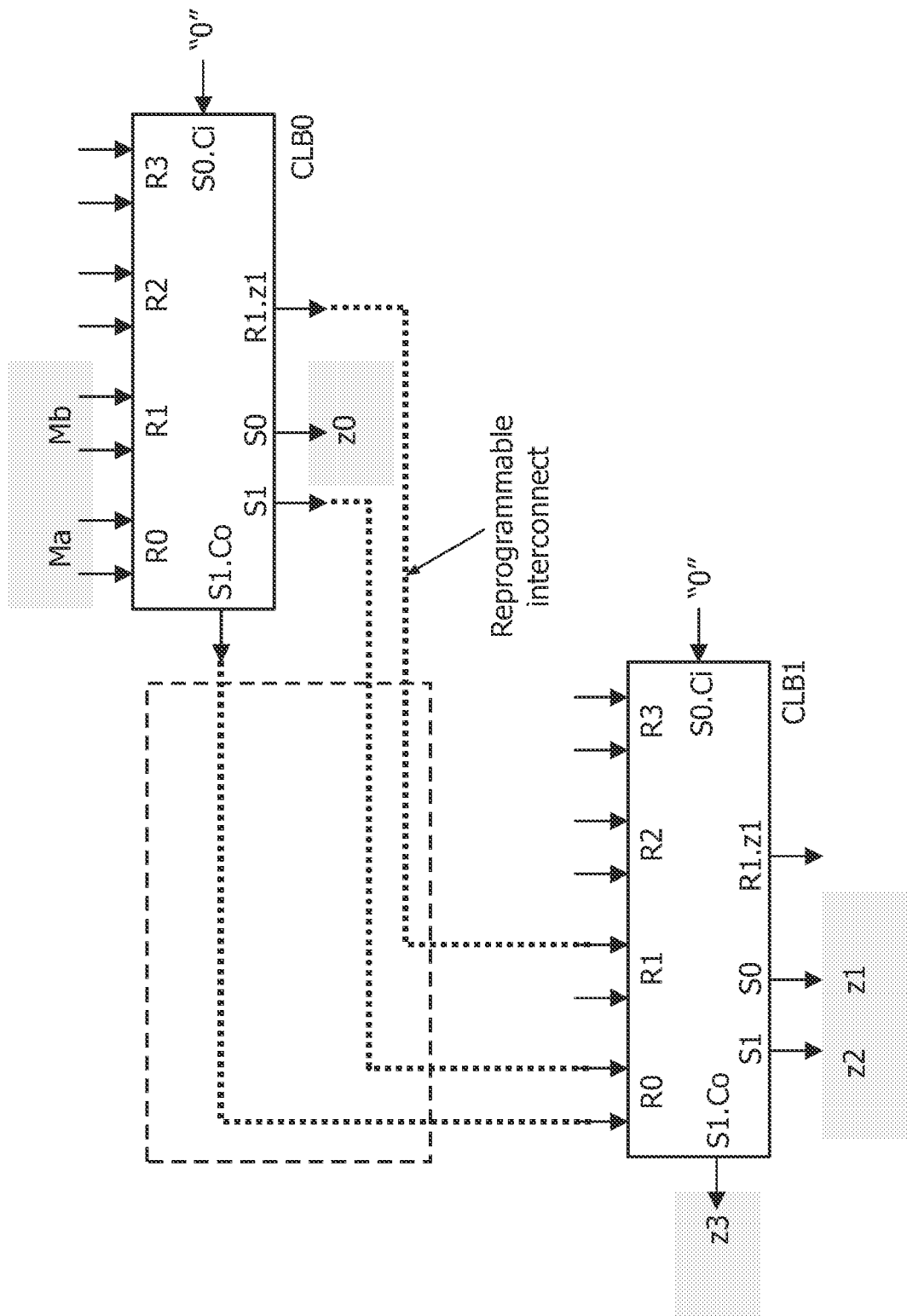

FIGS. 9A, 9B and FIG. 10 shows the spatial implementation of a multiplication in the configurable logic device according to the invention. FIG. 9A shows a configurable logic cell having the same fixed connections as described in this reference to FIG. 8. As in the serial implementation multiplicand Ma is loaded into register 20a and multiplicand Mb is loaded into register 20b. Register 20d is not used in this implementation. The registers 20a,b and c operate in a parallel mode. Register 20b should be transparent. Provided that the input signals Ma and Mb are stable, registers 20a, 20b may also be kept in a transparent parallel mode.

A desired application can be mapped in the configurable logic device according to the invention as follows. First a netlist is provided in .net format as described for example in Betz, V. et all., Rose, Architecture and CAD for Deep-Submicron FPGAs. Kluwer Academic Publishers, Boston 1999. This netlist is read by the PYTHAGOR place and route tool described in Danilin, A. et all. A Novel Toolset for the Development of the FPGA-like Reconfigurable Logic. In T. Rissa, S. J. E. Wilton, and P. H. W. Leong (eds.). Proceedings of the International Conference of Field-Programmable Logic and its Applications (FPL'2005), IEEE 2005, pp. 640-643. The PYTHAGOR place and route tool produces the programming bitstream.

In the next section various benchmarks are described. These have been obtained by flattening the initial RTL-VHDL netlist using a commercial synthesis tool followed by a conversion to the .net format. Functional correctness of the benchmarks is tested by running the Verilog netlist simulation. The testbench for the functional tests is created automatically by the toolflow.

The obtained layout of the configurable logic device in CMOS12 technology shows quite competitive results. A standard/cell implementation of a single configurable logic cell consumes about 0.014 mm including routing and configuration memory. Only 145 configuration bits are required to configure the cell (configuration FIFO size per cell). The average power consumption of one cell is as low as 90 nW/Mhz. A practical embodiment of one configurable device according to the invention, comprising of 683 configurable cells has an estimated average power consumption of less than 0.045 mW/MHz in most application cases. Some examples of basic logic operations and more complex applications mapped on the configurable logic device according to the invention are summarized in the Table 1.

TABLE 1

Some examples of basic logic operations and more complex applications mapped on the configurable logic device according to the invention.

| Function | temporal/spatial | Cells | Cycles |
|---|---|---|---|
| MUL8, | Temporal | 1 | 9 |
|  | Spatial | 8 | combinatorial delay |
| FIR, 1-tap, 8 bit | Temporal | 3 | 9 |
|  | Spatial | 9 | combinatorial delay |
| ACS, 8 bit, | Temporal | 1 | 9 |
|  | Spatial | 3 | combinatorial delay |
| Less than, 16 bit | Temporal | 1 | 2 |
|  | Spatial | 2 | combinatorial delay |
| Greater than, 16 bit | Temporal | 1 | 2 |
|  | Spatial | 2 | combinatorial delay |
| Equal, 16 bit, | Temporal | 1 | 2 |
|  | Spatial | 2 | combinatorial delay |
| ADD8, | Spatial | 1 | combinatorial delay |
| 2x ADD8, | Temporal | 1 | 2 |
| ADD16, | Temporal | 1 | 2 |
| SUB8, | Spatial | 1 | combinatorial delay |
| MUX 4:1, 8 bit |  | 1 | combinatorial delay |
| Counter, 8 bit |  | 1 | NA |

The difference in spatial and temporal mapping was already shown with a simple example of 2-bit array multiplier. In the more practical case of an 8-bit multiplier one cell can hold the whole 8 bit adder plus all the logic functions required to implement the partial products, only 8 cells are required to obtain the complete 16-bit result. Therein the spatial implementation connects the cells in the same way half- and full-adders are connected at the block level in a classical array multiplier like one described in Madisetti, V. K.: VLSI Digital Signal Processors. Butterworth-Heinemann, Newton 1995.

The input and output registers of the cell are bypassed and the multiplier has the critical path of around 35 ns (alternatively, the stages can be pipelined increasing the latency to achieve 180 MHz clock frequency). The temporal mapping uses only one cell storing the intermediate results and partial products in the internal registers. This implementation has a latency of 9 clock cycles and cannot be pipelined but achieves almost 240 MHz clock frequency.

A complete 64-state Viterbi decoder was mapped onto ASTRA. The decoder comprises three components: Branch metrics computation, path metrics computation, and trace-back. As the computational requirements for branch metrics are very small, a trade off of area for time for this component does not result in a significant area gain. The trace-back occupation cannot be folded in time, so that only a spatial mapping is possible. For the path metrics (the well known ACS–add-compare-select–operation), it is worthwhile to make a time trade of. A temporal implementation of the ACS computation reduces the area use of that component with a factor 3. This results in a factor 1.8 for the area reduction of the whole decoder (ACS+branch metrics+trace-back).

Figure 11:
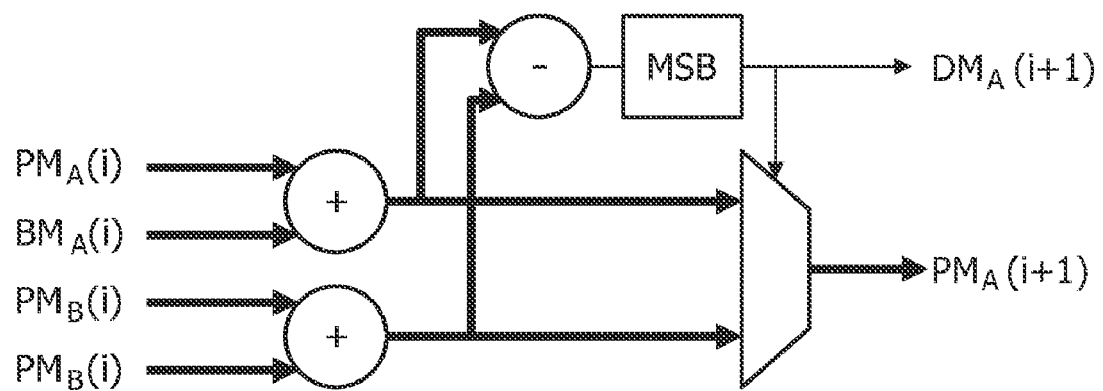
FIG. 11 illustrates the compare add select operation.
Figure 12:
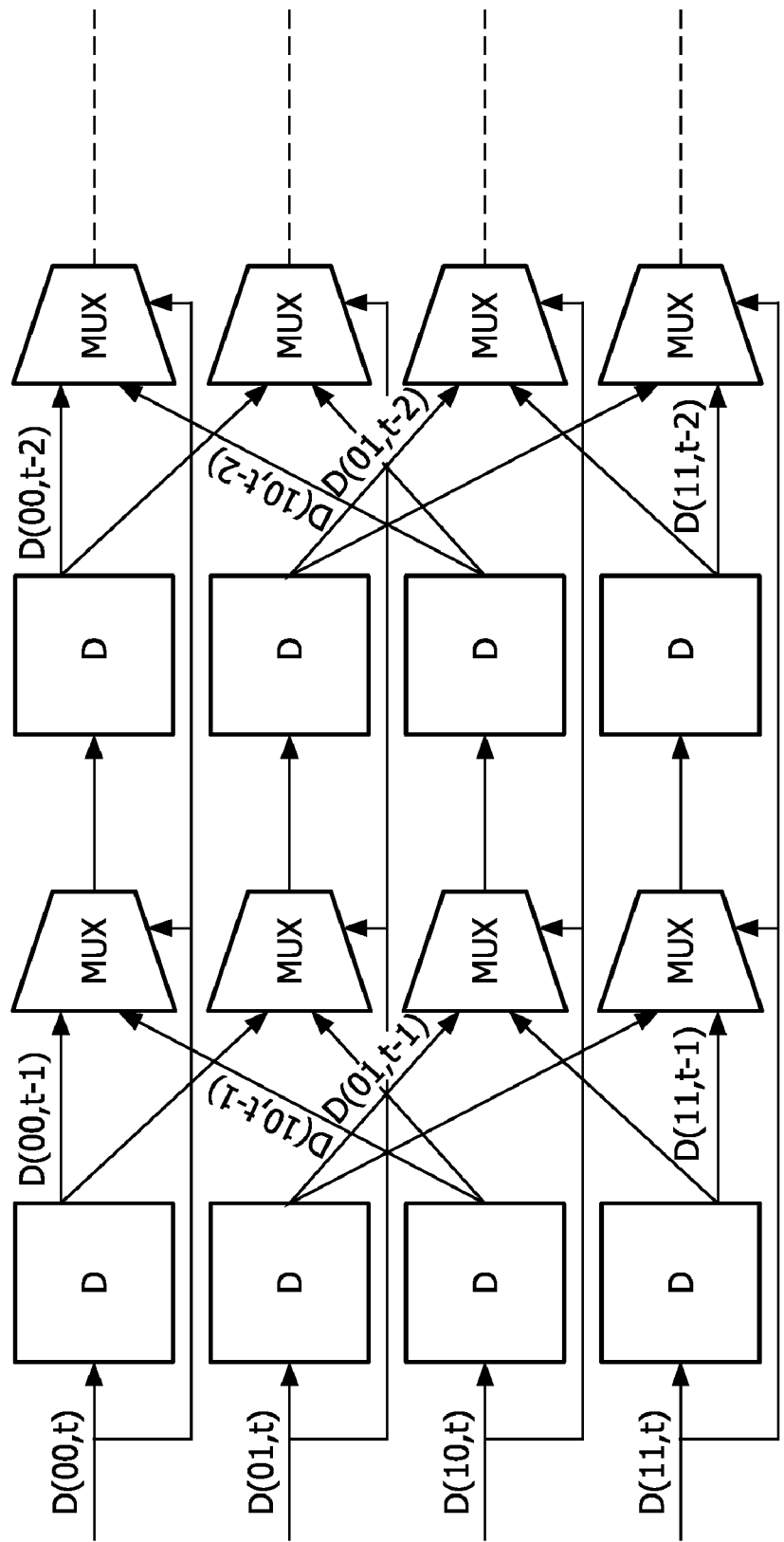
FIG. 12 shows an example of the mapping of a state transition diagram in hardware as registers connected via multiplexers.

Assuming the coding rate of 1/2, every user bit is encoded by 2 channel bits (forming the so-called channel symbol). Most receivers are working with so-called soft bits, which means that every channel bit is represented as a 3-5 bit integer value (i.e. the range from −7 to 7 in case of 4 bit integer with 7 and 7 representing ideal 0 and 1 respectively; Non-ideal values like 2, 1, 4 etc. can occur due to channel noise during transmission). There are 4 ideal channel symbols, which can be transmitted: (7,7), (7,−7), (−7,7), (−7,−7). In the branch metric computation step, the Manhattan distance between these ideal symbols and the received symbol is computed. Taking into account the symmetry of the symbol space, these computations can be reduced to three 4-bit additions and three 4-bit subtractions. In the path metrics computation step several add-compare-select (ACS) operations have to be performed. For the convolutional code with constraint length 7, 64 ACS operations need to be computed per user bit. The structure of the ACS operation is shown in FIG. 11. The 8-bit result of the ACS operation is fed back as input to other ACS units and is not used in the last step of the algorithm called trace-back. During the trace back step, 64 decision bits produced by the ACS units as MSB of subtraction operation (which is the equivalent of comparison) are used to decode the initial values of the user bits. The easiest way to implement the trace back is to map the state-transition diagram of the code directly to hardware as registers connected via multiplexers. FIG. 12 shows an example of such a structure for a very simple code with only 4 states. A more practical decoder with 64 states requires 16 times the amount of flipflops and multiplexers. Due to the high area and power consumption trace back is often implemented with embedded memory blocks instead of registers. In that case the multiplexer logic is replaced by address generation unit in this case.

A complete fully parallel (spatial) implementation of the Viterbi decoder for convolutional code with constraint length 7 and code rate 1/2 (about the same type of decoder used in wireless LAN receivers) requires 289 configurable cells according to the present invention (approximately 4 mm$^2$), and can be clocked at 60 MHz. The same Viterbi decoder implemented as dedicated standard cell design using embedded memory (in contrast to the implementation according to the invention requires about 0.4 mm in CMOS12,so the present invention is only one order of magnitude less efficient than an ASIC for this benchmark.

Corresponding Xilinx IP core (with soft bits of width 3) for Virtex-II devices requires slightly more than 1000 slices (and 4 Block RAM modules) running at 156 MHz, see Xilinx, Inc.: IEEE802-compatible Viterbi decoder. Product Specification V1.1, Nov. 10, 2004.

Figures 13A, 13B, 13C:
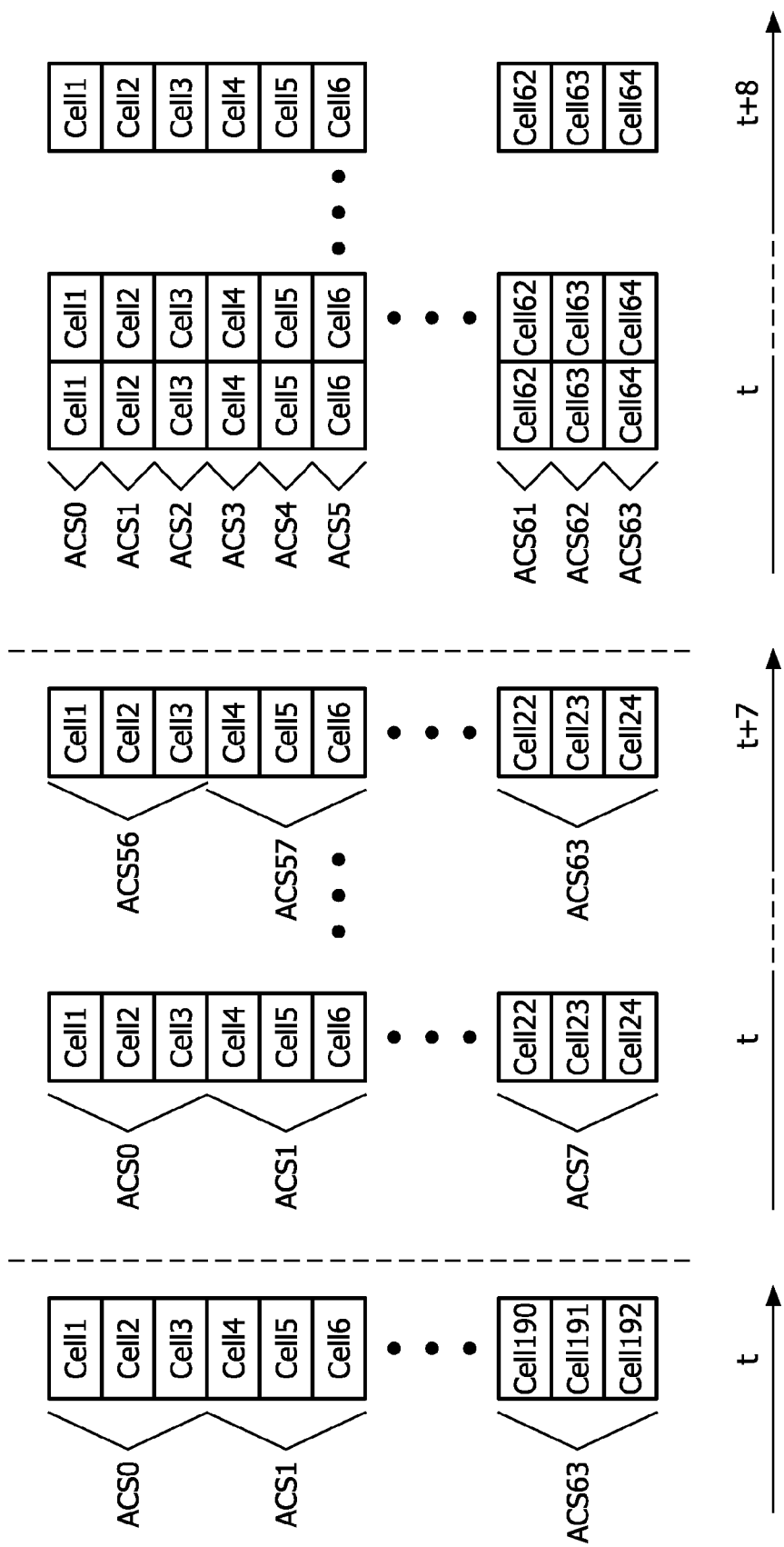
FIG. 13 shows three alternatives to map the ACS algorithm on a configurable logic device according to the present invention.

In a conventional ASIC or FPGA implementation it is possible to fold the ACS computation by using only a fraction of required ACS block i.e. 8 instead of 64. In this case, several cycles are needed to compute all the path metrics but only a fraction of silicon area is required. Trace back cannot be folded due to its control structure (the same decision bit is used to control the whole chain of multiplexers). The present invention allows this folding approach as well, but in addition it also allows to change the internal ACS implementation in almost the same manner, see FIG. 13. Options a) and b) are general algorithmic transformations which can be implemented on a configurable logic device according to the invention, as well as conventional FPGA and ASIC architectures.

Option c is the additional degree of freedom offered by the present invention. By reusing the same cell over 9 clock cycles for one ACS computation instead of its spatial mapping to 3 cells, the amount of logic to implement the Viterbi decoder can be reduced to 161 cells (almost a factor of 1.8). The temporal mapping of the Viterbi decoder can achieve around 20 mbps throughput, the spatial mapping around 60 mbps, so depending on the application requirements one of the implementation options can be chosen. A Viterbi decoder for wireless LAN requires 54 mbps in its fastest mode.

Figure 14:
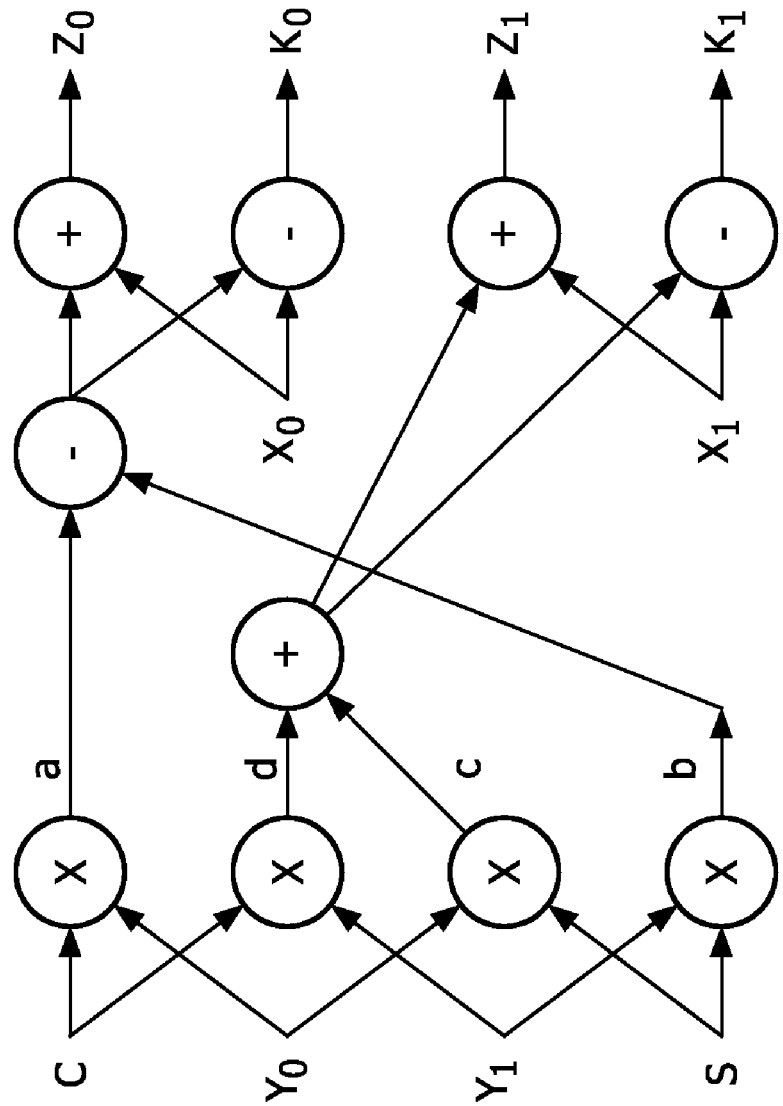
FIG. 14 shows an example of an 8 points Fast Fourier transform using 12 butterfly operations.

An example of a somewhat more complex application is the Fast Fourier transform (FFT). An FFT of 8 points requires the computation of 12 butterfly operations, an example of which is shown in FIG. 14. FFT butterflies can be mapped in time or space just the same way as Viterbi ACS operations at the algorithmic level e.g. FFT for 8 points can be reused as the building block for the 64 point FFT (which is also one on the building blocks of the Wireless LAN receivers). An 8 point FFT can be mapped spatially onto a configurable logic device according to the invention with 470 cells running at 30 MHz or temporally with 132 cells running at 240 MHz with 8 cycles additional latency. The spatial mapping of the FFT benchmark corresponds to about 6.4 mm in CMOS12. The ASIC implementation of the same netlist requires around 0.25 mm, about 25 times less.

A final example which was tested on the configurable logic device according to the invention is a 16 tap FIR filter with 8 bit coefficients. Its spatial mapping requires 153 cells running at 91 MHz and temporal mapping—only 35 cells running at 181 MHz. The ASIC area for the same application is around 0.18 mm, so the spatial mapping on a configurable logic device according to the invention is only about factor 12 worse.

Figure 15:
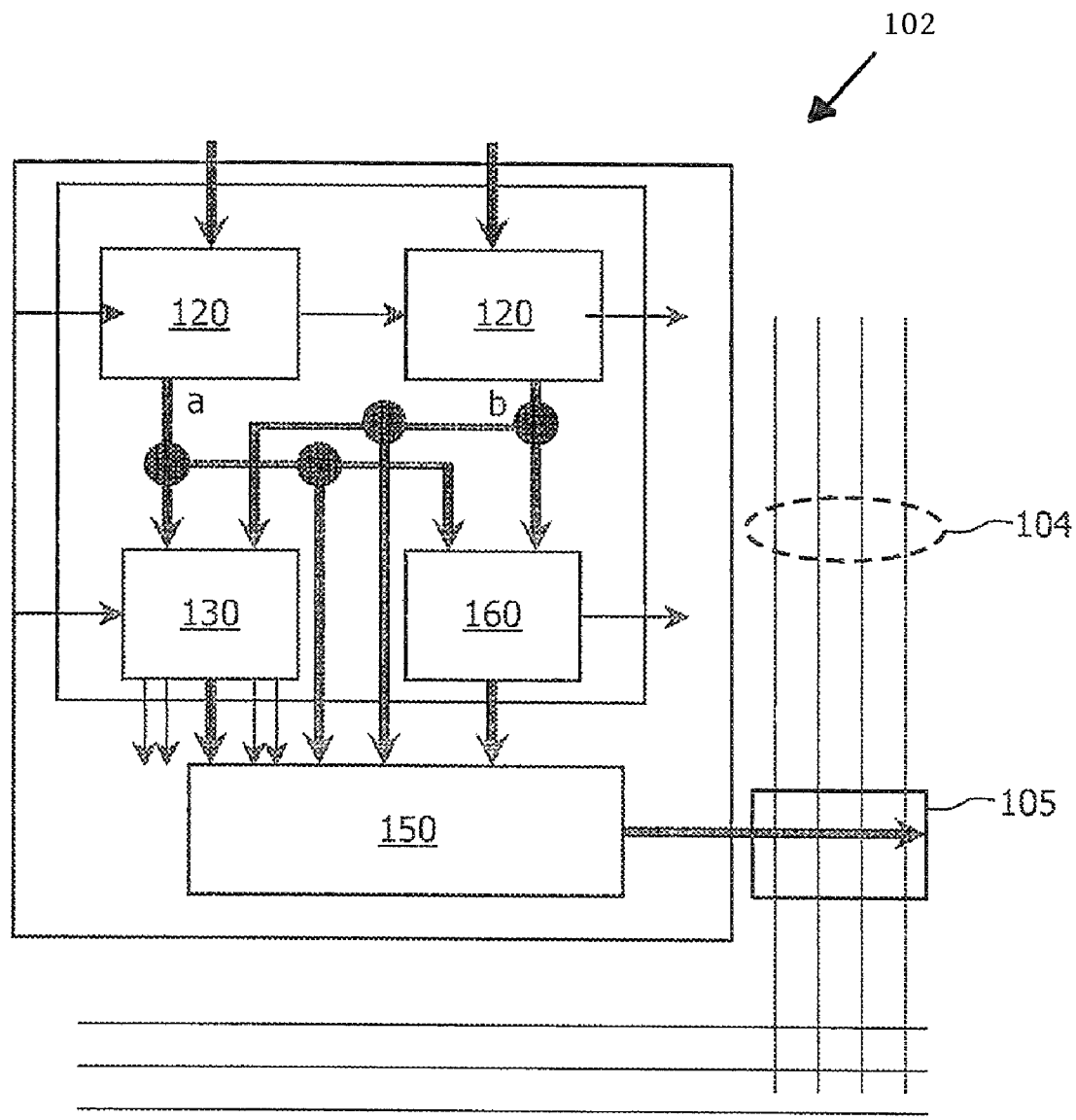
FIG. 15 shows the configurable logic cell of a second embodiment of the device shown in FIG. 1.

FIG. 15 shows a more simplified version of the configurable logic cell 102 in a device according to the invention. Parts therein corresponding to those in FIGS. 1 and 2 have a reference number that is 100 higher. The configurable logic cell in FIG. 15 is simplified in that it has only two registers 120a, 120b.

As in the 4 register version any of the registers 120a, 120b, can be coupled via the data routing network 104 to an output of each of its 4 neighbors. That output on its turn can be selected from the output signal provided by the two registers 120a, 120b, the functional unit 130 and the intermediate selection facility 160.

In addition the output selection facility 150 provides its output signal via a cross bar 105 (see also FIG. 16) to the control interconnect 104. It selects this output signal from the input signals it receives from the two registers 120a, 120b, the functional unit 130 and the intermediate selection facility 160.

Figure 16:
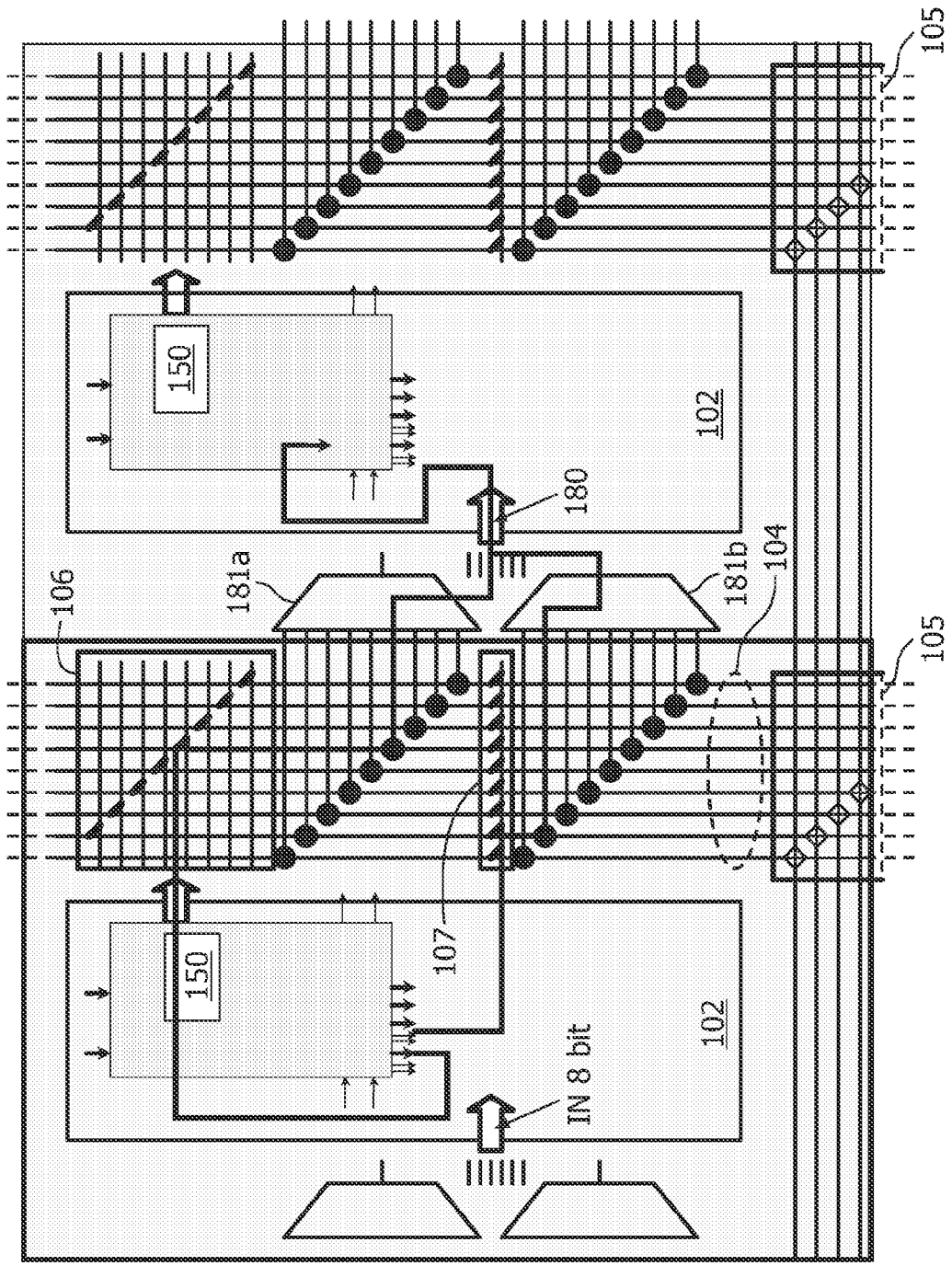
FIG. 16 shows a parts of the configurable logic device with two such configurable logic cells.

As shown in FIG. 16 the crossbar 106 allows arbitrary ones of the signal lines to be connected to the interconnect 104. A further crossbar 107 allows a control signal, e.g. the carry out signal to be provided to one or more of the interconnect lines. The configurable logic cell has an additional input port 180 coupled to a control to data selection facility that comprises a set of multiplexing elements 181a, 181b. Each thereof select one bit of the input bits available at the control interconnect 104. Figure also shows the crossbars 105 partly in more detail.

The embodiment of FIGS. 15 and 16 sometimes requires a larger number of configurable logic cells. On the other hand however the area per cell is reduced from 0.014 mm$^2$ to 0.011 mm$^2$.

Table 2 shows the required number of configurable logic cells as shown in FIG. 15 for various applications in comparison to the required number of configurable logic cells in the embodiment shown in FIG. 2 with 4 registers.

TABLE 2

A comparison of the required number of configurable logic cells of the embodiments of FIG. 2, and the embodiment of FIG. 15 for various applications.

| Function | #CLBs (2 reg) | #CLBs (4 reg) |
|---|---|---|
| MUL8, temporal | 2 | 1 |
| MUL8, spatial | 8 | 8 |
| ADD8 spatial | 1 | 1 |
| SUB8 spatial | 1 | 1 |
| ADD16, spatial | 2 | 1 |
| MUX 2:1, 8 bit | 1 | |
| FIR, 8 bit, 1 tap temporal | 3 | 3 |
| ACS, 8 bit temporal | 3 | 1 |
| LUT 4:1 | 1 | |
| Counter, 8 bit | 1 | 1 |
| EQ | 1 | |
| LT, GT | 1 | |
| LUT 2:1 8 bit | 1 | |
| Full shuffle 8 bit | 2 | |
| Shift-rotate 16 bit | 1 | |

It is remarked that the scope of protection of the invention is not restricted to the embodiments described herein. Neither is the scope of protection of the invention restricted by the reference numerals in the claims. The word 'comprising' does not exclude other parts than those mentioned in a claim. The word 'a(n)' preceding an element does not exclude a plurality of those elements. Means forming part of the invention may both be implemented in the form of dedicated hardware or in the form of a programmed general purpose processor. The invention resides in each new feature or combination of features.

The invention claimed is:

1. Configurable logic device comprising a plurality of configurable logic cells, a configurable logic cell comprising:
    a plurality of multi-bit registers, at least one being accessible both in a parallel and in a serial fashion,
    a functional unit coupled to two or more of the registers, comprising a chain of functional unit segments that each comprise an AND gate and a 1-bit full adder receiving an output of the AND-gate,
    an output selection facility for providing an output signal of the configurable logic cell selected from two or more input signals, at least one of the input signals being provided by one of the multi-bit registers, and another provided by the functional unit,
    an input selection facility for selectively providing one of two or more input signals to one of the multi-bit registers, at least one of the input signals being provided by the functional unit, the input selection facility causing a bit-shift-operation to a first of the input signals when selected and causing another one of the input signals when selected to be passed unchanged, and
    a bit selection facility for selectively providing a bit of an output signal of one of the multi-bit registers to the functional unit.

2. Configurable logic device according to claim 1, wherein the plurality of multi-bit registers is two, and wherein each of the multi-bit registers provides an input signal to the output selection facility.

3. Configurable logic device according to claim 1, wherein the configurable logic cells are coupled by separate routing structures for routing data and control signals.

4. Configurable logic device according to claim 3, wherein the routing structure for data signals selectively couples a register cell to any data output of any of its 4 direct neighbors.

5. Configurable logic device according to claim 3 wherein the routing structure for control signals provides for a global routing through the configurable logic device.

6. Configurable logic device according to claim 1, wherein the output selection facility receives an input signal from the input selection facility.

7. Configurable logic device according to claim 1, further comprising an intermediate selection facility coupled to the multi-bit registers, for selectively transmitting one of a set of output signals received from those registers as a further input signal for the output selection facility.

8. Configurable logic device according to claim 7, wherein the intermediate selection facility comprises a first and a second selection layer, wherein the first selection layer serves to select one of the plurality of input signals provided by the multi-bit registers, and wherein the second layer serves as the bit selection facility.

9. Configurable logic device according to claim 1, further comprising a comparator for comparing an output signal of a predetermined one of the registers with the selectively transmitted one of the set of output signals.

* * * * *